(12) United States Patent
Zha et al.

(10) Patent No.: US 8,323,002 B2
(45) Date of Patent: Dec. 4, 2012

(54) HEAT DISSIPATION DEVICE AND FAN ASSEMBLY THEREOF

(75) Inventors: Xin-Xiang Zha, Shenzhen (CN); Ye-Fei Yu, Shenzhen (CN); Jun Ding, Shenzhen (CN); Jer-Haur Kuo, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 347 days.

(21) Appl. No.: 12/482,459

(22) Filed: Jun. 11, 2009

(65) Prior Publication Data
US 2010/0166574 A1 Jul. 1, 2010

(30) Foreign Application Priority Data
Dec. 31, 2008 (CN) .......................... 2008 1 0306747

(51) Int. Cl.
*F04B 35/01* (2006.01)
*H05K 7/20* (2006.01)
*F16H 7/02* (2006.01)
(52) U.S. Cl. ..................... 417/362; 417/423.5; 361/697; 474/88
(58) Field of Classification Search .................. 417/362, 417/423.5, 423.14; 361/694–697, 700; 165/80.2, 165/80.3, 80.4, 104.33; 474/85, 88, 84, 86; 415/213.1, 175–178
See application file for complete search history.

(56) References Cited

U.S. PATENT DOCUMENTS

| 3,898,019 | A | * | 8/1975 | Reznick et al. | ................ | 417/362 |
| 7,447,020 | B2 | * | 11/2008 | Xia et al. | ...................... | 361/695 |
| 7,542,290 | B2 | * | 6/2009 | Tracy et al. | ................... | 361/696 |
| 7,633,755 | B2 | * | 12/2009 | Zhou et al. | ..................... | 361/697 |
| 7,878,772 | B2 | | 2/2011 | Rexhauser et al. | | |
| 7,891,411 | B2 | * | 2/2011 | Zhou et al. | ................... | 165/80.3 |
| 7,967,059 | B2 | * | 6/2011 | Li et al. | ......................... | 165/80.3 |
| 2005/0191955 | A1 | * | 9/2005 | Horng et al. | .................. | 454/184 |
| 2006/0204371 | A1 | * | 9/2006 | Rexhauser et al. | ........... | 417/243 |

FOREIGN PATENT DOCUMENTS
CN 1835347 A 9/2006
CN 101237756 A 8/2008
* cited by examiner

*Primary Examiner* — Devon Kramer
*Assistant Examiner* — Bryan Lettman
(74) *Attorney, Agent, or Firm* — Altis Law Group, Inc.

(57) ABSTRACT

A heat dissipation device includes a heat sink, a cooling fan, an electric motor and a belt. The cooling fan includes a fan housing and an impeller. The impeller includes a hub, a plurality of fan blades and a shaft extending from the hub and having a distal end protruded out of the fan housing. A fan pulley is fixed to the distal end of the shaft. The electric motor includes a driving pulley. The belt has one end engaging with the driving pulley of the electric motor and an opposite end engaging with the fan pulley of the cooling fan. Rotation of the driving pulley of the electric motor is transferred to the fan pulley via the belt to cause the impeller to rotate.

9 Claims, 9 Drawing Sheets

HEAT DISSIPATION DEVICE AND FAN ASSEMBLY THEREOF

BACKGROUND

1. Technical Field

The disclosure relates to heat dissipation devices, and particularly to a heat dissipation device having an improved fan assembly.

2. Description of Related Art

Electronic components operating at high speed generate excessive heat which must be removed efficiently to ensure normal operation. Typically, a heat dissipation device attached to the electronic component provides such heat dissipation.

For example, U.S. Pat. No. 6,311,766 provides such a heat dissipation device for dissipating heat generated by a CPU. The heat dissipation device includes a fan, a heat sink, and a fixing device which attaches the fan to the heat sink. The fan is box-shaped, and includes a rectangular housing, a hub received in a central portion of the housing and a plurality of blades extending radially from the hub. The hub includes a circular top wall and a cylindrical sidewall extending perpendicularly from an outer periphery of the top wall. The top wall and the sidewall define a cylindrical space for accommodating a magnet and a stator therein for driving the blades to rotate in the housing. Typically, the stator includes layered yokes with stator coils wound thereon, a printed circuit board (PCB) electrically connected with the stator coils, and upper and lower insulating frames insulated the layered yokes from the stator coils. Thus, the stator has a large size, and a large space for accommodating the stator is accordingly needed, which increases a size of the hub.

When the fan operates, the top wall of the hub prevents air from flowing into an area just under the top wall, so that the area just under the top wall lacks airflow and forms as an airflow dead area to cause heat to accumulate there. The size of the hub is large, and a size of the airflow dead area is large accordingly. Thus, an efficiency of the cooling fan is greatly affected.

It is thus desirable to provide a heat dissipation device which can overcome the described limitations.

DETAILED DESCRIPTION

Figure 1:
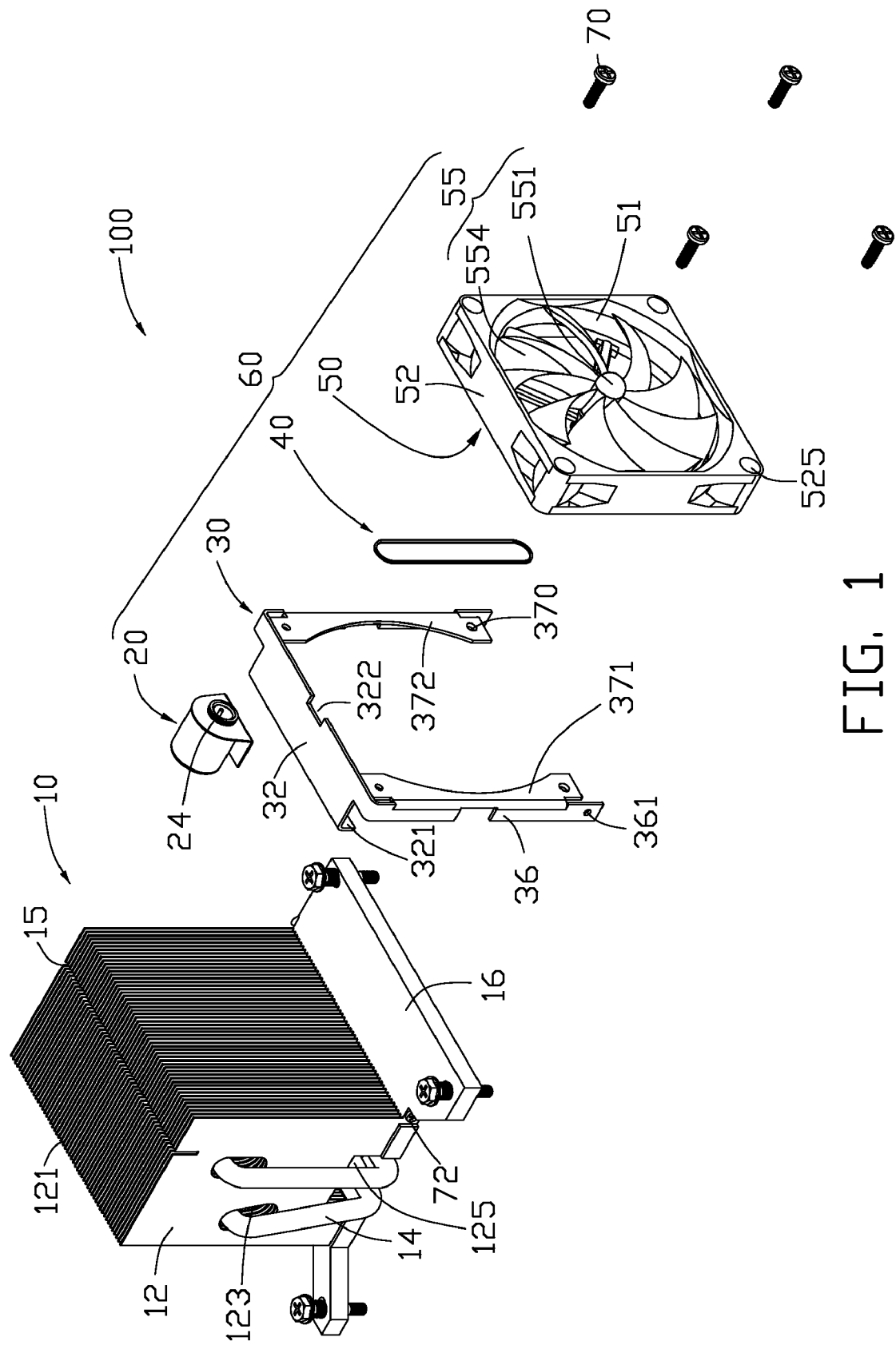
FIG. 1 is an isometric, exploded view of a heat dissipation device according to a first embodiment.

Reference will now be made to the drawing figures to describe the present heat dissipation device in detail.

Figure 2:
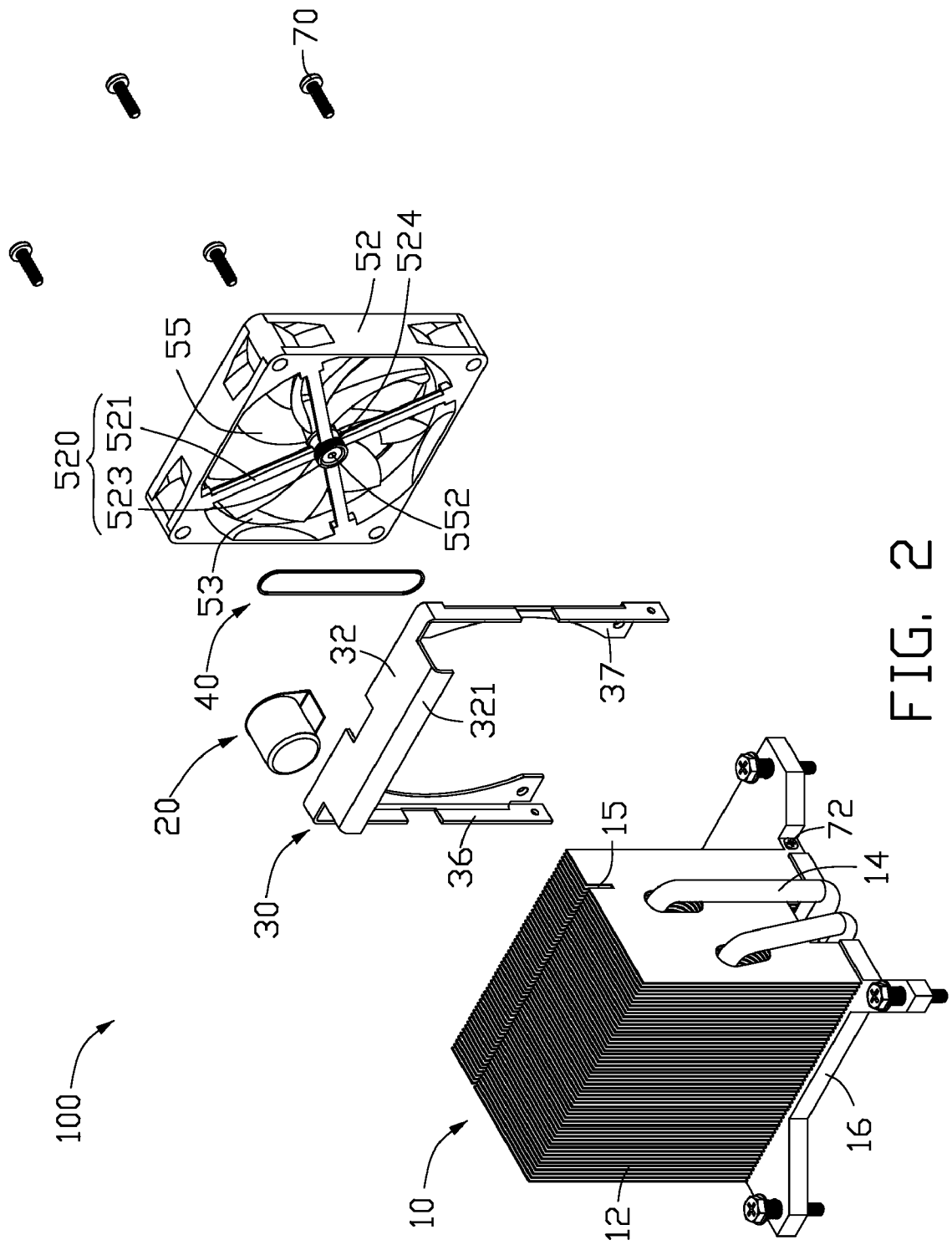
FIG. 2 is a view similar to FIG. 1, but viewed from another aspect.

FIGS. 1-2 illustrate a heat dissipation device 100 in accordance with a first embodiment of the disclosure. The heat dissipation device 100 is for dissipating heat generated by an electronic component (not shown). The heat dissipation device 100 includes a heat sink 10 and a fan assembly 60.

The heat sink 10 includes a heat absorbing plate 16 contacting with the electronic component, a fin unit 12 arranged on the heat absorbing plate 16 and two heat pipes 14 connecting the heat absorbing plate 16 with the fin unit 12. Each heat pipe 14 is about "U" shaped. Each of the heat pipes 14 includes a middle section, and an evaporator section and a condenser section extending perpendicularly from two opposite ends of the middle section, respectively. The fin unit 12 includes a plurality of fins 121 being paralleled to and spaced from each other. The fin unit 12 is located on one side, i.e., a left side of a top surface of the heat absorbing plate 16 with the fins 121 arranged one by one along a front-to-rear direction of the heat absorbing plate 16. Each of the fins 121 is rectangular, and defines two through holes 123 at an upper portion for extension of the condenser sections of the heat pipes 14, respectively. A rectangular receiving groove 125 is defined in a middle portion of a bottom end of the fin unit 12. The evaporator sections of the heat pipes 14 are embedded into and received in the receiving groove 125 side by side, and tightly contact with a bottom surface of the fin unit 12 and the top surface of the heat absorbing plate 16. A slot 15 is defined through top ends of the fins 121 of the fin unit 12 at a position adjacent to a lateral side (i.e., right side) of the fin unit 12.

The fan assembly 60 includes an electric motor 20, a fixing frame 30, a belt 40 and a cooling fan 50. The cooling fan 50 includes a rectangular fan housing 52 and an impeller 55 received in the fan housing 52. The fan housing 52 defines a circular air inlet 51 at one side (i.e., right side) and an air outlet 53 at an opposite side (i.e., left side) along an axial direction of the fan housing 52. A bearing bracket 520 is formed at the air outlet 53 for supporting the impeller 55 thereon. The bearing bracket 520 includes a cylindrical shaft tube 523 located on a central portion of the air outlet 53 and four ribs 521 connecting an outer periphery of the shaft tube 523 with an inner periphery of the fan housing 52 at the air outlet 53. The ribs 521 extend radially from the shaft tube 523. Two neighboring ribs 521 are perpendicular to each other. The impeller 55 includes a hub 551 and a plurality of fan blades 554 extending outwardly and radially from a circumference surface of the hub 551. A shaft 552 extends perpendicularly from an inner surface of the hub 551 towards the shaft tube 523 of the bearing bracket 520. The shaft 552 is rotatably received in the shaft tube 523, and a distal end of the shaft 552 traverses through the shaft tube 523 to protrude out of the fan housing 52. A fan pulley 524 is securely mounted to the distal end of the shaft 552, whereby when the fan pulley 524 rotates, the shaft 552 and the impeller 55 rotate accordingly. The fan pulley 524 includes a pulley groove in an outer periphery thereof, which surrounds the distal end of the shaft 552. Four mounting holes 525 are defined in four corners of the fan housing 52, respectively.

The fixing frame 30 has a generally rectangular configuration corresponding to the fan housing 52. The fixing frame 30 includes an elongated top wall 32, a fastening wall 321 extending downwardly from a lateral side, i.e., a left side of the top wall 321, and front and rear sidewalls 36 extending downwardly and perpendicularly from front and rear ends of the top wall 32, respectively. The top wall 32 defines a cutout 322 at a middle of another lateral side, i.e., a right side thereof. Each of the front and rear sidewalls 36 defines a screwing hole 361 at a bottom end thereof. A first securing plate 371 extends the front sidewall 36 towards the rear sidewall 36. A second securing plate 372 extends the rear sidewall 36 towards the front sidewall 36. Each of the first and second securing plates 371, 372 has an arced inner periphery corresponding to about a half of the inner periphery of the air outlet 53 of the fan housing 52. Four threaded holes 370 corresponding to the mounting holes 525 of the fan housing 52 are defined in top and bottom ends of the first and second securing plates 371, 372, respectively. The fastening wall 321 has a size substantially equaling to that of the slot 15 of the fin unit 12; thus the fastening wall 321 can be fittingly received in the slot 15 of the fin unit 12 when the fixing frame 30 is mounted to the fin unit 12.

The electric motor 20 includes a driving pulley 24 on one side thereof. The motor 20 is mounted on a top side of the top wall 32 of the fixing frame 30. The driving pulley 24 includes a pulley groove in an outer periphery thereof. The driving pulley 24 protrudes horizontally from the electric motor 30 towards the cooling fan 50 and locates just above the cutout 322 of the top wall 32. A diameter of the driving pulley 24 is smaller than a width of the cutout 322.

Figure 3:
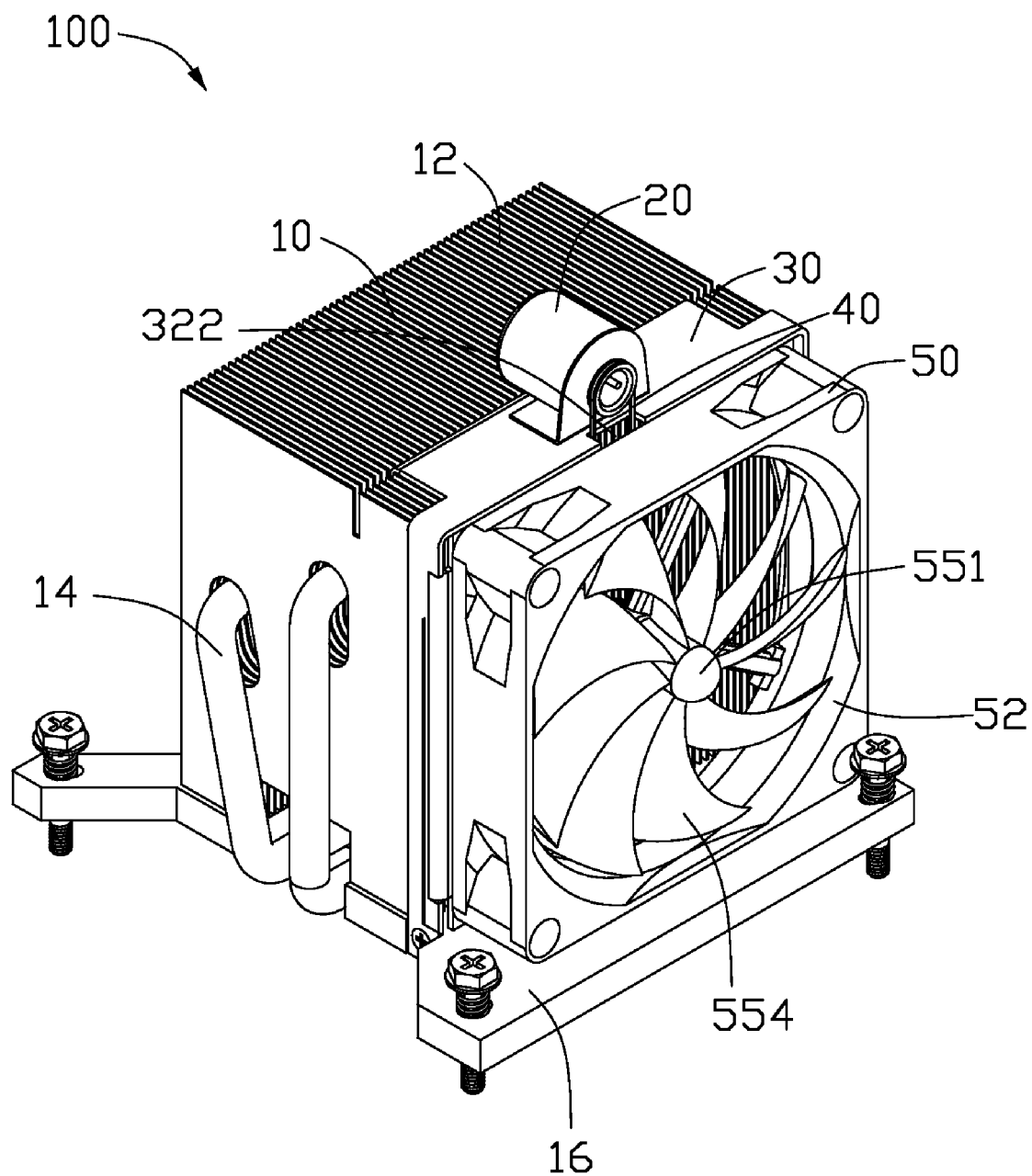
FIG. 3 is an assembled view of the heat dissipation device of FIG. 1.

Referring to FIG. 3, the fin unit 10 is arranged on the left side of the top surface of the heat absorbing plate 16 and the heat pipes 14 interconnect the heat absorbing plate 16 with the fin unit 10. The cooling fan 50 is mounted on a right side of the top surface of the heat absorbing plate 16, with the air outlet 53 facing and adjacent to the fin unit 12 and the air inlet 51 opposing and away from the fin unit 12. The fixing frame 30 is sandwiched between the fin unit 12 and the cooling fan 50 for firmly and reliably connecting the cooling fan 50 with the heat sink 10. The mounting holes 525 of the fan housing 52 are coaxial with the threaded holes 370 of the first and second securing plates 371, 372, respectively. Fasteners 70 respectively traverse through the mounting holes 525 of the fan housing 52 and engage into the threaded holes 370 of the first and second securing plates 371, 372, to thereby connect the cooling fan 50 and the fixing frame 30 together.

The fan pulley 524 protrudes towards the fixing frame 30, and is located just under the cutout 322 of the top wall 32. The electric motor 20 is affixed to the top side of the top wall 32 with the driving pulley 24 protruding just above the cutout 322 of the top wall 32. Accordingly, the driving pulley 24 of the electric motor 20 is substantially collinear with the fan pulley 524 of the cooling fan 50. The belt 40 vertically extends through the cutout 322, with one end engaging in the pulley groove of the driving pulley 24 and an opposite end engaging in the pulley groove of the fan pulley 524 for associating the electric motor 20 with the shaft 552 of the fan impeller 55 of the cooling fan 50.

The front and rear sidewalls 36 of the fixing frame 30 abut against a foremost fin 121 and a rearmost fin 121 of the fin unit 12, respectively, for restricting a movement of the fixing frame 30 and the cooling fan 50 along a front-to-rear direction thereof. The first and second securing plates 371, 372 of the fixing frame 30 abut against a right side of the fin unit 12, and the fastening wall 321 is embedded into the slot 15 of the fin unit 12. Thus, the first and second securing plates 371, 372 and the fastening wall 321 cooperatively restrict a movement of the fixing frame 30 and the cooling fan 50 along a left-to-right direction thereof. Bolts 72 respectively traverse through the screwing holes 361 of the front and rear sidewalls 36 of the fixing frame 30 and engage into the heat absorbing plate 16 from front and rear ends of the heat absorbing plate 16, respectively, for maintaining a firm connection between the fixing frame 30 and the heat sink 10.

Since the belt 40 associates the driven pulley 24 of the electric motor 20 with the fan pulley 524 of the cooling fan 50, rotation of the drive pulley 24 is transferred to the fan pulley 524 by the belt 40. The driving pulley 24 is operatively connected to the fan pulley 524 of the cooling fan 50 though the belt 40. Thus, rotation of the driving pulley 24 of the electric motor 40 is transferred to the fan pulley 524 of the shaft 552 which drives the impeller 55 of the cooling fan 50 to rotate. Therefore, no stator and magnet for driving the impeller 55 to rotate is needed to be mounted in the hub 551 of the cooling fan 50, to thereby greatly decrease a size of the hub 551.

Figure 4:
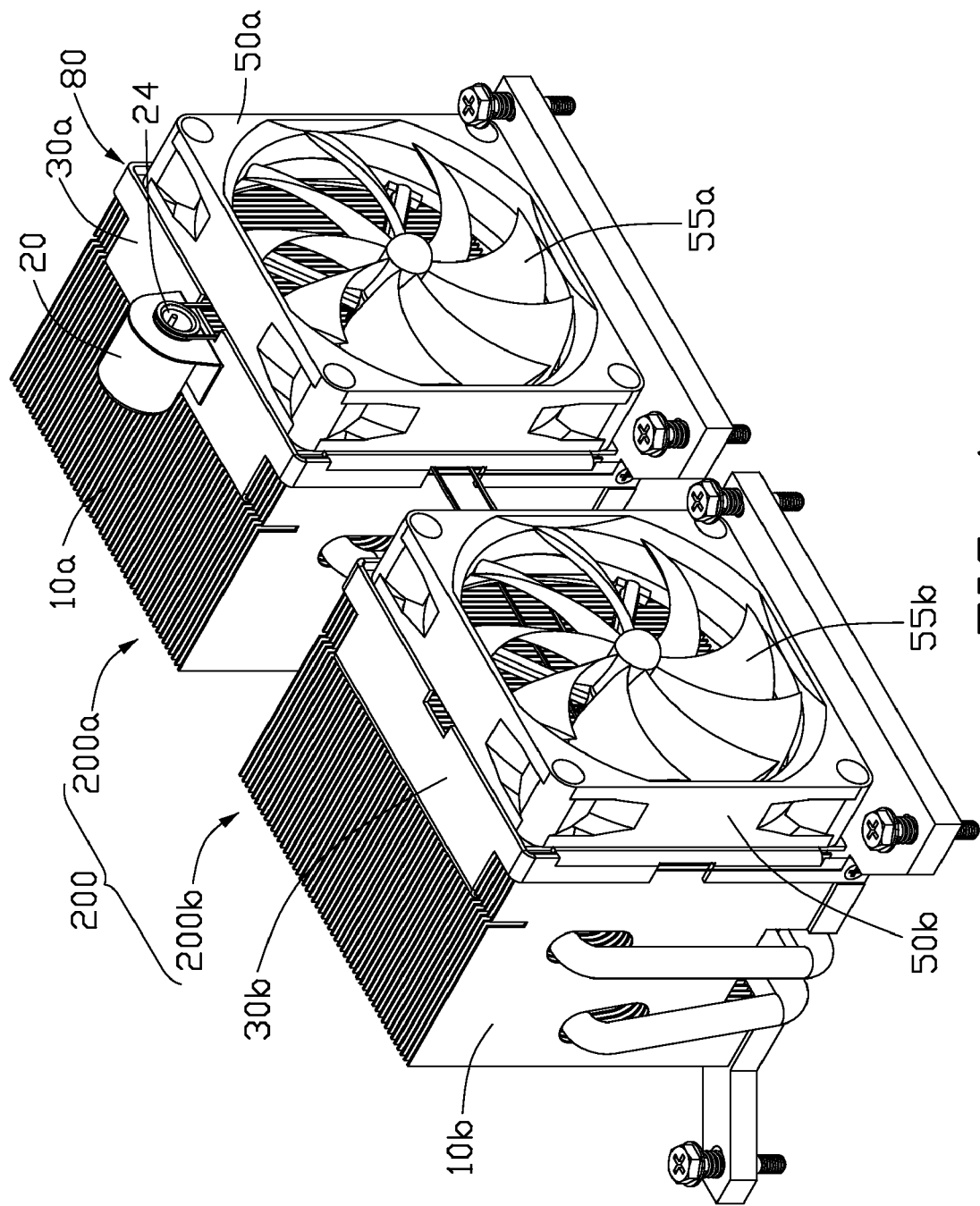
FIG. 4 is an isometric, assembled view of a heat dissipation device according to a second embodiment.
Figure 5:
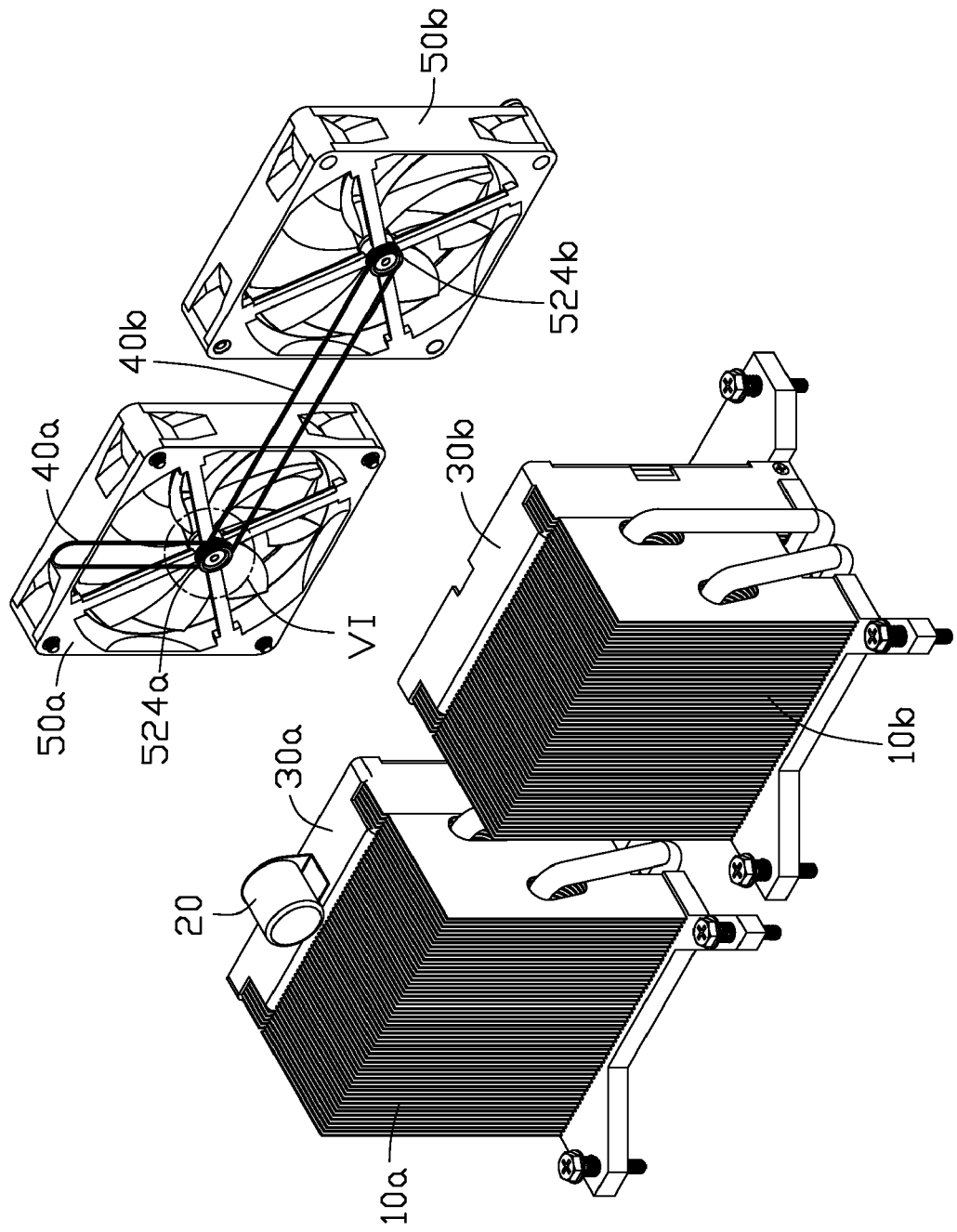
FIG. 5 is an exploded view of the heat dissipation device of FIG. 4.
Figure 6:
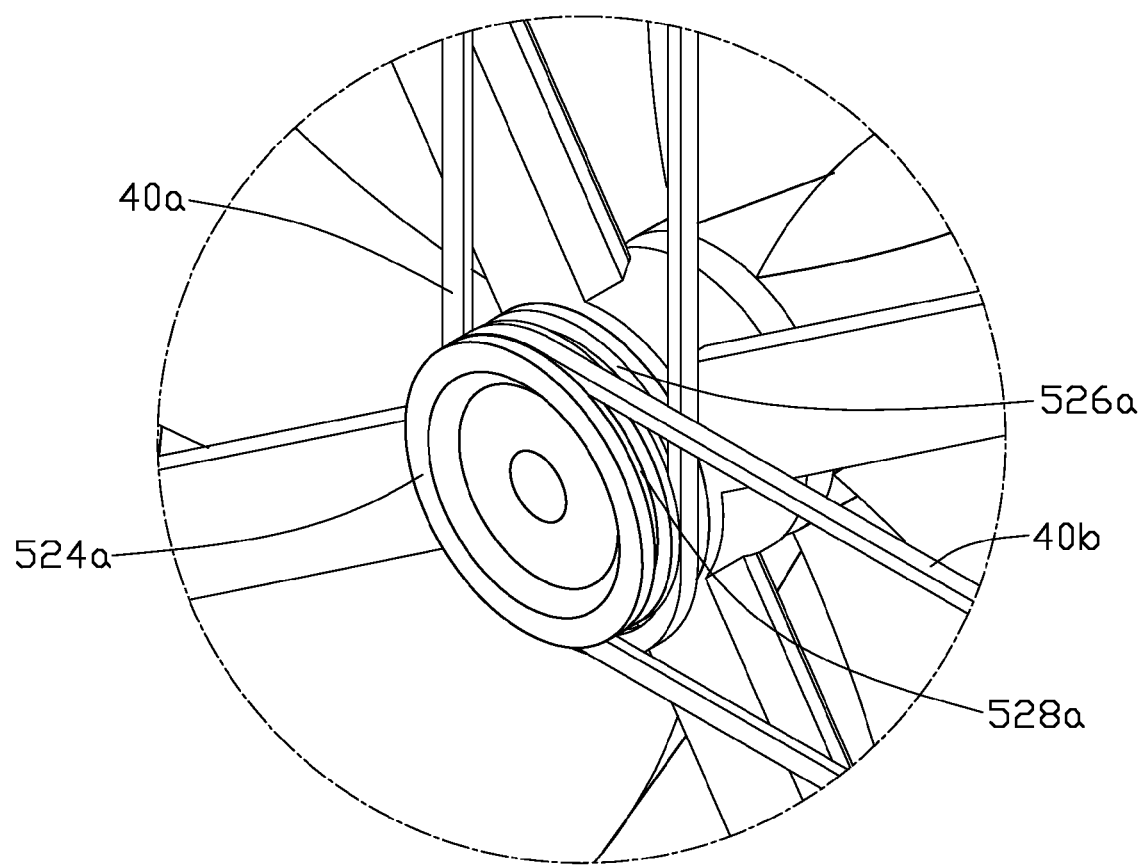
FIG. 6 is an enlarged view of a circled portion VI of FIG. 5.

Referring to FIGS. 4-6, a heat dissipation device 200 in accordance with a second embodiment of the disclosure is shown. The heat dissipation device 200 includes first and second heat sinks 10a, 10b, an electric motor 20, first and second fixing frames 30a, 30b, first and second belts 40a, 40b, and first and second cooling fans 50a, 50b. The first heat sink 10a, the electric motor 20, the first fixing frame 30a, the first belt 40a and the first cooling fan 50a are assembled together to form an integral first heat dissipation unit 200a which has substantially the same configuration as the heat dissipation device 100 of the first embodiment, only differing in that a fan pulley 524a of the first cooling fan 50a includes a first pulley groove 526a and a second pulley groove 528a, the first belt 40a extends vertically to associate the driving pulley 24 of the electric motor 20 with the first pulley groove 526a, and the second belt 40b extends horizontally with one end engaged in the second pulley groove 528a and an opposite end connected with the fan pulley 524b of the second cooling fan 50b.

The second heat sink 10b, the second fixing frame 30b, the second belt 40b and the second cooling fan 50b are assembled together to form a second integral heat dissipation unit 200b which has substantially the same configuration as the heat dissipation device 100 of the first embodiment, only differing in that no electric motor is mounted on the second fixing frame 30b, and the fan pulley 524b of the second cooling fan 50b is associated with the fan pulley 524a of the first cooling fan 50a via the second belt 40b. The first and second heat dissipation units 200a, 200b are arranged laterally side by side. The second belt 40b which connects the fan pulley 524a of the first cooling fan 50a with the fan pulley 524b of the second cooling fan 50b is perpendicular to the first belt 40a which connects the fan pulley 524a of the first cooling fan 50a with the driving pulley 24 of the electric motor 20. In this embodiment, rotation of the driving pulley 24 of the electric motor 20 is transferred to the fan pulley 524a of the first cooling fan 50a via the first belt 40a to rotate the impeller 55a of the first cooling fan 50a, and rotation of the fan pulley 524a of the first cooling fan 50a is transferred to the fan pulley 524b of the second cooling fan 50b via the second belt 40b to rotate the impeller 55b of the second cooling fan 50b.

Figure 7:
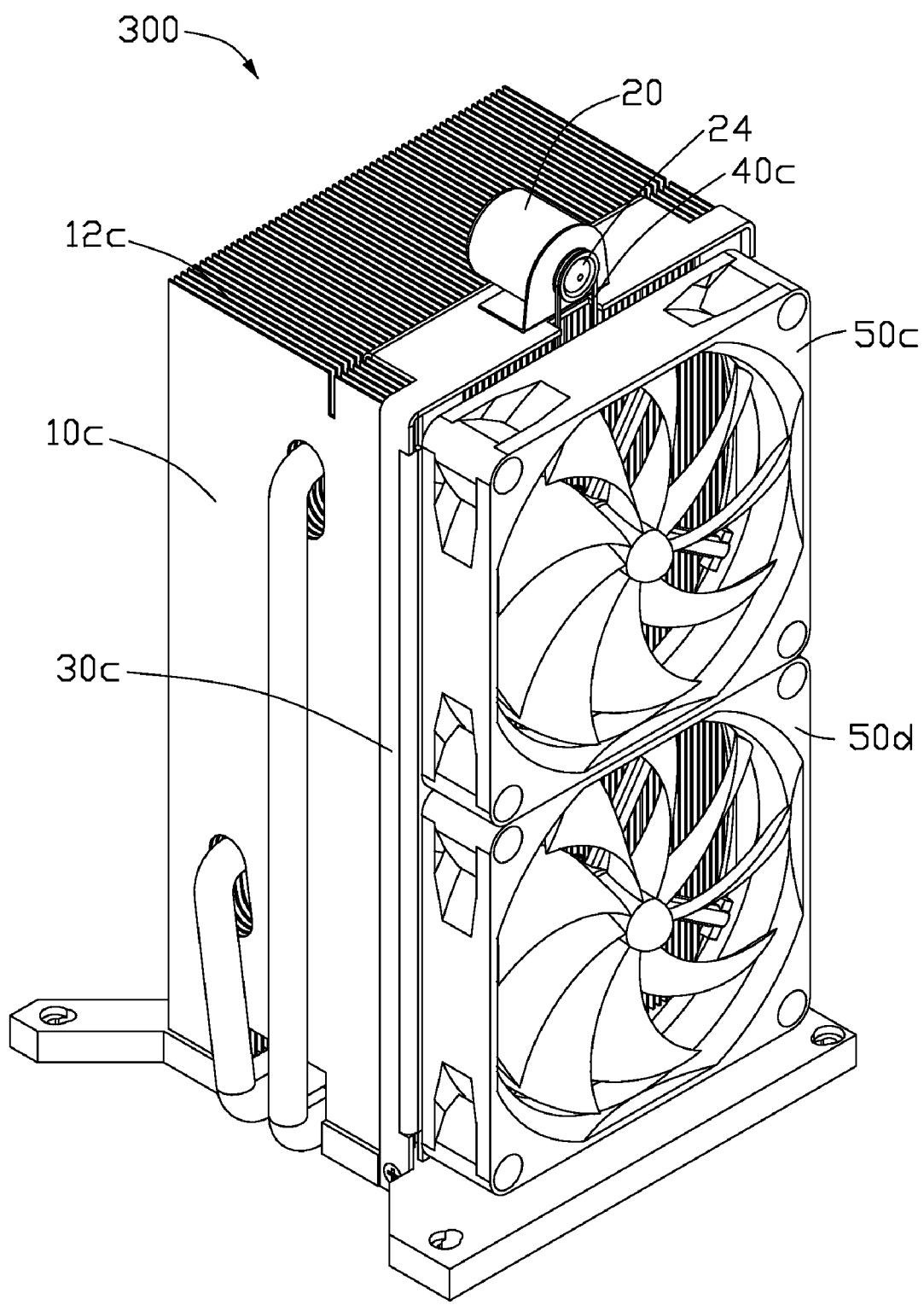
FIG. 7 is an isometric, assembled view of a heat dissipation device according to a third embodiment.
Figure 8:
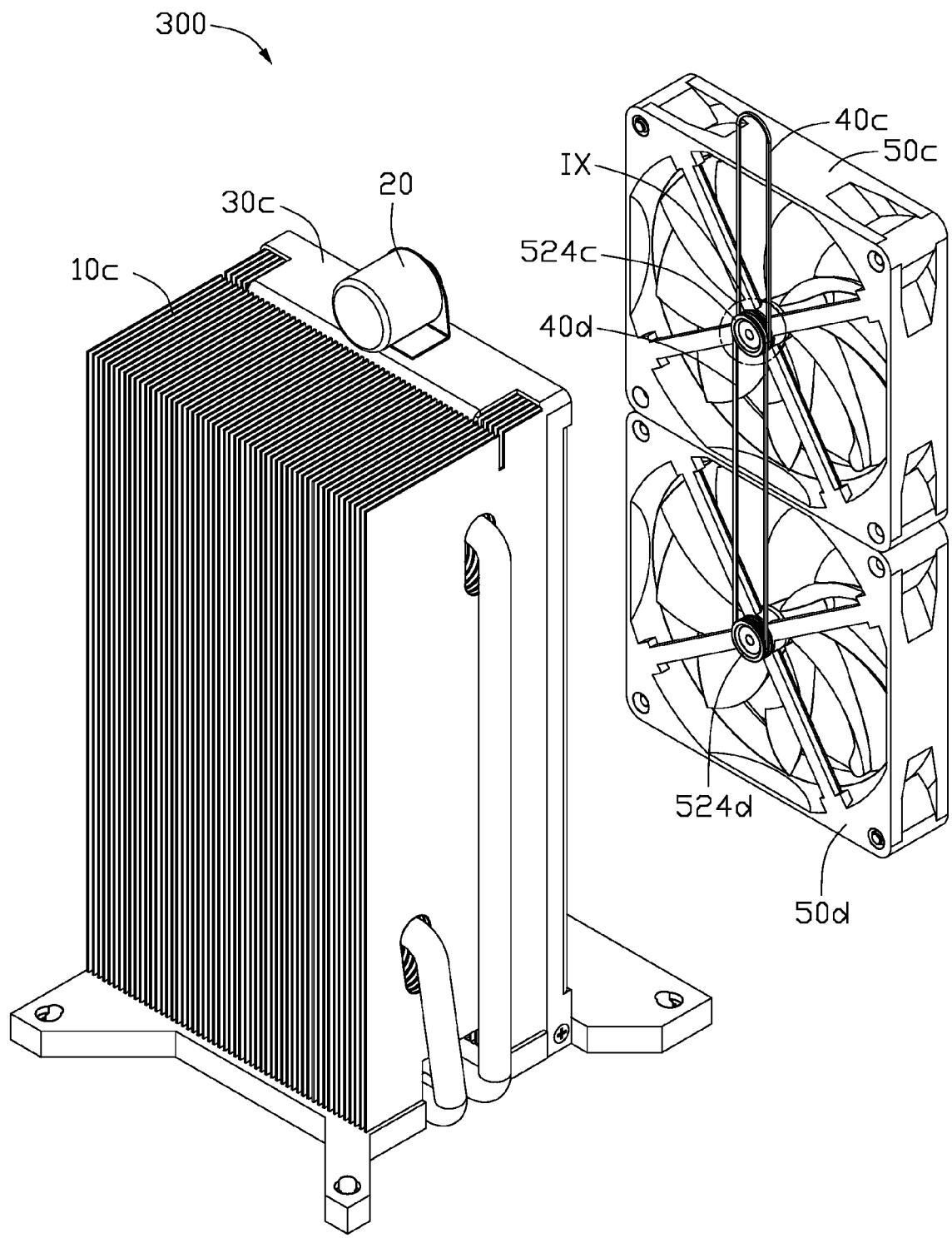
FIG. 8 is an exploded view of the heat dissipation device of FIG. 7.
Figure 9:
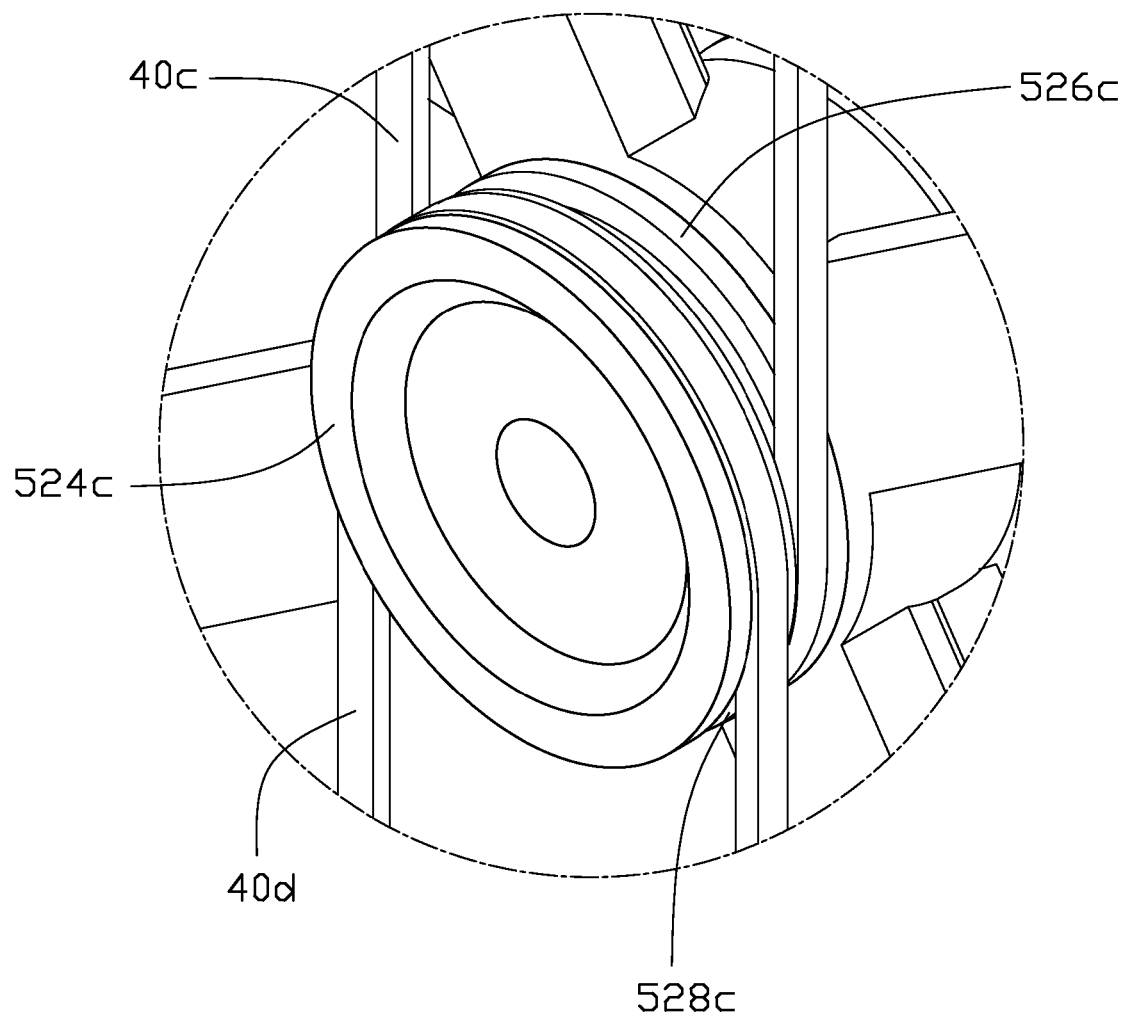
FIG. 9 is an enlarged view of a circled portion IX of FIG. 8.

Referring to FIGS. 7-9, a heat dissipation device 300 in accordance with a third embodiment of the disclosure is shown. The heat dissipation device 300 includes a heat sink 10c, a fixing frame 30c, upper and lower cooling fans 50c, 50d, an electric motor 20, and upper and lower belts 40c, 40d.

The heat sink 10c and the fixing frame 30c respectively has substantially the same configuration as the heat sink 10 and the fixing frame 30 of the first embodiment, only differing in that a fin unit 12c of the heat sink 10c has a height being about twice of a height of the fin unit 12 of the first embodiment, and the fixing frame 30c has a height being about twice of a height of the fixing frame 30 of the first embodiment. Each of the upper and lower cooling fans 50c, 50d has the same configuration as the cooling fan 50 the first embodiment, only differing in that a fan pulley 524c of the upper cooling fan 50c has a first pulley groove 526c and a second pulley groove 528c. The upper and lower cooling fans 50c, 50d are arranged in series along a height direction of the fixing frame 30c. The electric motor 20 is mounted on a top side of the fixing frame 30c. The upper belt 40c extends vertically to associate the driving pulley 24 of the electric motor 20 with the first pulley groove 526c of the fan pulley 524c of the upper cooling fan 50c. The lower belt 40d extends vertically to associate the second pulley groove 528c of the fan pulley 524c of the upper cooling fan 50c with the fan pulley 524d of the lower cooling fan 50d. Thus, the upper belt 40c is parallel to the lower belt 40d, and the upper and lower belts 40c, 40d cooperatively form a substantially vertically extended straight line.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a heat sink;
        a cooling fan mounted on the heat sink for providing a forced airflow towards the heat sink, the cooling fan comprising a fan housing and an impeller received in the fan housing, the impeller comprising a hub and a plurality of fan blades extending radially from the hub, a shaft extending from the hub and having a distal end protruded out of the fan housing, a fan pulley arranged around the distal end of the shaft;
        an electric motor comprising a driving pulley corresponding to the fan pulley of the cooling fan;
        a belt having one end engaging with the driving pulley of the electric motor and an opposite end engaging with the fan pulley of the cooling fan for associating the electric motor with the shaft of the impeller of the cooling fan, rotation of the driving pulley of the electric motor being transferred to the fan pulley via the belt to cause the impeller of the cooling fan to rotate; and
        another cooling fan and another belt, the another cooling fan being provided with another fan pulley, the another belt associating the fan pulley of the cooling fan with the another fan pulley of the another cooling fan,
        wherein the cooling fans are arranged laterally side by side, the belt being perpendicular to the another belt.

2. The heat dissipation device as described in claim 1, wherein the heat sink comprises a heat absorbing plate and a fin unit arranged on a top surface of the heat absorbing plate, the fan housing defining an air inlet at one side and an air outlet at opposite side, the cooling fan being arranged on the top surface of the heat absorbing plate with the air outlet facing and adjacent to the fin unit.

3. The heat dissipation device as described in claim 2, wherein a bearing bracket is formed in the air outlet, the bearing bracket comprising a cylindrical shaft tube on a central portion of the air outlet and a plurality of ribs connecting the shaft tube with the fan housing, the distal end of the shaft extending through the shaft tube and being rotatably received in the shaft tube.

4. The heat dissipation device as described in claim 2, further comprising a fixing frame sandwiched between the cooling fan and the fin unit for connecting the cooling fan and the heat sink together, the fixing frame comprising an elongated top wall and two sidewalls extending perpendicularly from two opposite ends of the top wall, the two sidewalls abutting against fins located at foremost and rearmost positions of the fin unit, respectively.

5. The heat dissipation device as described in claim 4, wherein a fastening wall extends downwardly from a lateral side of the top wall, a slot being defined through a top end of the fin unit for receiving the fastening wall therein.

6. The heat dissipation device as described in claim 4, wherein a plurality of mounting holes are defined in the fan housing, two securing walls extending inwardly from the sidewalls of the fixing frame, respectively, a plurality of screwing holes corresponding to the mounting holes of the fan housing being defined in the securing walls, fasteners respectively traversing through the mounting holes of the fan housing and the screwing holes of the securing walls for connecting the cooling fan with the fixing frame.

7. The heat dissipation device as described in claim 4, wherein a cutout is defined in the top wall, the electric motor being mounted on the top wall, the driving pulley of the electric motor being located just above the cutout, the fan pulley of the cooling fan being located just under the cutout.

8. A fan assembly comprising:
    a cooling fan comprising:
        a fan housing defining an air inlet at one side and an air outlet at an opposite side;
        an impeller received in the fan housing, the impeller comprising a hub and a plurality of fan blades extending radially from the hub, a shaft extending from the hub and having a distal end protruded out of the fan housing, a fan pulley arranged around the distal end of the shaft;
        an electric motor comprising a driving pulley corresponding to the fan pulley of the cooling fan; and
        a belt having one end engaging with the driving pulley of the electric motor and an opposite end engaging with the fan pulley of the cooling fan for associating the electric motor with the shaft of the impeller of the cooling fan, rotation of the driving pulley of the electric motor being transferred to the fan pulley of the cooling fan via the belt to cause the impeller of the cooling fan to rotate; and
        another cooling fan and another belt, the another cooling fan being provided with another fan pulley, the another belt associating the fan pulley of the cooling fan with the another fan pulley of the another cooling fan,
        wherein the cooling fans are arranged laterally side by side, the belt being perpendicular to the another belt.

9. The fan assembly as described in claim 8, wherein a bearing bracket is formed at the air outlet, the bearing bracket comprising a cylindrical shaft tube at a central portion of the air outlet and a plurality of ribs connecting the shaft tube with the fan housing, the distal end of the shaft extending through the shaft tube and being rotatably received in the shaft tube.

* * * * *